United States Patent
Weiss et al.

(10) Patent No.: US 9,543,756 B2
(45) Date of Patent: Jan. 10, 2017

(54) PULSE GENERATOR CIRCUIT ARRANGEMENT AND METHOD FOR GENERATING PULSED SIGNALS FOR INSULATION FAULT LOCATION IN IT NETWORKS

(71) Applicant: Bender GmbH & Co. KG, Gruenberg (DE)

(72) Inventors: Carsten Weiss, Laubach (DE); Tobias Groh, Muecke (DE)

(73) Assignee: BENDER GMBH & CO. KG, Gruenberg (DE)

( * ) Notice: Subject to any disclaimer, the term of this patent is extended or adjusted under 35 U.S.C. 154(b) by 798 days.

(21) Appl. No.: 13/893,549

(22) Filed: May 14, 2013

(65) Prior Publication Data

US 2013/0307338 A1 Nov. 21, 2013

(30) Foreign Application Priority Data

May 15, 2012 (DE) ........................ 10 2012 208 111

(51) Int. Cl.
*H02H 7/125* (2006.01)
*H02M 7/04* (2006.01)
(Continued)

(52) U.S. Cl.
CPC .............. *H02H 7/125* (2013.01); *G01R 27/18* (2013.01); *G01R 31/025* (2013.01);
(Continued)

(58) Field of Classification Search
CPC ... G01R 27/125; G01R 31/025; G01R 31/127; G01R 31/083; G01R 27/18; H02H 7/125; H02H 7/04
(Continued)

(56) References Cited

U.S. PATENT DOCUMENTS 4,291,204 A * 9/1981 Crick ..................... G01R 31/10
324/456
4,325,022 A * 4/1982 Pelletier ................. G01R 31/11
324/127
(Continued)

FOREIGN PATENT DOCUMENTS

CN 201955425 U 8/2011
DE 4339946 A1 6/1995
(Continued)

OTHER PUBLICATIONS

State Intellectual Property Office of People's Republic of China, First Office Action and Search Report, Application No. 201310174956.9, Jun. 9, 2015 [English Language Translation Only].
European Patent Office, Search Report, Application No. EP 13167780, Oct. 1, 2013, 3 pages.

*Primary Examiner* — Rexford Barnie
*Assistant Examiner* — Terrence Willoughby
(74) *Attorney, Agent, or Firm* — Quarles & Brady LLP

(57) ABSTRACT

A pulse generator circuit arrangement for the search for insulation faults in IT networks includes a rectifier circuit for transforming an IT network voltage into a DC intermediate circuit and switching elements having a trigger signal input for switching on and off a DC intermediate circuit voltage. A circuit device downstream of the switching elements generates a pulsed current to be supplied to the IT network. The circuit arrangement includes a control and evaluating logic for determining the insulation resistance of the IT network and also a circuit device for generating the pulsed current, which is formed as a current regulating device and allows a dynamic adjustment of the pulsed current depending on the determined insulation resistance.

11 Claims, 2 Drawing Sheets

(51) Int. Cl.
  *G01R 31/02* (2006.01)
  *H04B 3/46* (2015.01)
  *G01R 31/12* (2006.01)
  *G01R 27/18* (2006.01)

(52) U.S. Cl.
  CPC .......... *G01R 31/1272* (2013.01); *H02M 7/04* (2013.01); *Y10T 307/615* (2015.04)

(58) Field of Classification Search
  USPC ...................................... 307/64, 125; 383/84
  See application file for complete search history.

(56) References Cited

U.S. PATENT DOCUMENTS 4,721,916 A * 1/1988 Hanasawa .......... G01R 31/1272
                                                        324/520
2007/0132459 A1 * 6/2007 Yamamoto ............. G01R 27/18
                                                        324/541
2009/0153156 A1 * 6/2009 Ishii ....................... G01R 27/18
                                                        324/704

FOREIGN PATENT DOCUMENTS

| | | | | |
|---|---|---|---|---|
| DE | 19826410 | A1 | 1/1999 | |
| DE | 102004018918 | B3 | 7/2005 | |
| DE | 202005017996 | U1 | 3/2006 | |
| DE | 2005-052956 | * | 5/2007 | ............ G01R 27/18 |
| DE | 102005052956 | B3 | 5/2007 | |
| EP | 0654673 | A1 | 5/1995 | |
| EP | 2256506 | A1 | 12/2010 | |

* cited by examiner

US 9,543,756 B2

PULSE GENERATOR CIRCUIT ARRANGEMENT AND METHOD FOR GENERATING PULSED SIGNALS FOR INSULATION FAULT LOCATION IN IT NETWORKS

CROSS REFERENCE TO RELATED APPLICATION

This application claims the priority benefit of German Patent Application No. 10 2012 208 111.9 filed on May 15, 2012, which is fully incorporated herein by reference.

STATEMENT REGARDING FEDERALLY SPONSORED RESEARCH OR DEVELOPMENT

Not applicable.

FIELD OF THE INVENTION

The invention relates to a pulse generator circuit arrangement for insulation fault location in IT networks, comprising a rectifier circuit for transforming the IT network voltage into a DC intermediate circuit, switching elements having a trigger signal input for switching on and off a DC intermediate circuit voltage, and comprising downstream of the switching elements a circuit device for generating a pulsed current to be supplied to the IT network.

Further, the invention relates to a method for generating pulsed signals for insulation fault location in IT networks, comprising the signal processing steps: transformation of an IT network voltage into a DC intermediate circuit by means of a rectifier circuit, triggered switching on and off of a DC intermediate circuit voltage by means of switching elements having a trigger signal input and generation of a pulsed current to be supplied to the IT network.

BACKGROUND OF THE INVENTION

To ensure a high availability and operating security of the electric power supply and to guarantee personal safety in the area of electric installations, power supply networks are being increasingly employed whose active components are separated from the earth potential. In this type of power supply network, called unearthed IT system, an active conductor can have an insulation fault without the running operation having to be interrupted since due to the ideally infinitely high impedance value between the conductor and earth in this first fault case no closed circuit can form. In this context, a faulty state of the IT system, in particular a fault to frame or an earth fault, meaning a conductive connection of inactive system parts to conductive operating parts or a conducting connection of an active conductor to the ground, are to be understood as an insulation fault.

It becomes clear from this point of view that the resistance in the network to be monitored, including all resistances of all connected operating parts to earth (insulation resistance), have to be monitored constantly because a possible further fault on another active conductor (second fault) could cause a fault loop and the fault current running therein in connection with an overcurrent protection circuit would result in a shut-down of the system. Through a constant insulation monitoring of the unearthed IT system a drop in the insulation resistance can be detected and reported in time.

According to the state of the art, the measuring processes for determining the insulation resistance are based in principle on the superposition of a measuring voltage, generated in an insulation monitoring device, between the conductors of the IT network and the ground so that a specific measuring current proportional to the insulation fault occurs, which causes a corresponding voltage drop on a measuring resistance of the insulation monitoring device. If the voltage drop exceeds a certain value as a result of a dropped insulation resistance and thus of a higher measuring current, a report is triggered. In order to prevent measurement distortions with regard to a reliable insulation monitoring in today's modern networks, in which a plurality of operating parts are equipped with electronic components, the distortions being caused for example by direct current components generated by inverters, the measuring methods have been continuously developed further. In pure alternating current networks without distorting direct current components, the method of superimposing a measuring DC voltage can be applied, whereas in faulty environments a controlled, specifically clocked measuring voltage for driving pulsed signals is employed.

When a drop of the insulation resistance has been detected, insulation fault location begins in that the insulation monitoring device or a separate testing device generates a test current and supplies it to the IT network. To be able to reliably detect insulation faults in a DC network and due to the available measuring technology, the test current supplied for insulation fault location preferably also has a pulse-shaped flow of alternating polarity (pulsed current) so that the test current flows through both conductors (L+ and L-) in an alternating manner. This test current signal is detected by all measuring current transformers which lie in the faulty cable outlet of the network and is analyzed and reported by an insulation fault analyzing device. By means of the allocation of measuring current transformer/circuit, respectively cable outlet, the fault position can be located.

In this approach common according to the state of the art it proves disadvantageous that the determination of the insulation resistance and the localization of insulation faults present two separate, self-contained processes. As a result, for example for making a new measurement of the insulation resistance during the already initiated fault search, the supplying of the test pulses has to be interrupted in order to be able to perform the insulation resistance measurement with a suitable measuring current. Thus, a simultaneous determination of the insulation resistance during the fault search is not possible in a simple manner.

Furthermore, devices according to the state of the art do offer the possibility to stabilize the test current in the fault search during the duration of the pulse by means of corresponding circuit devices, such as current regulators and to limit the test current to one or several maximum values, but these configurations only constitute a relatively crude adjustment of the pulsed current to the network conditions so that often an unnecessarily high pulsed current is generated. In the course of this, an excessive heat build-up can occur in the generator circuit, which so far was only counteracted by the use of large-scale cooling bodies or excess temperature deactivations. In a disadvantageous manner these countermeasures thus lead directly or indirectly to an increase in costs due to operation disruptions.

Furthermore, in shut-down IT systems which have to be inspected no voltage is available to drive the pulsed current. Here, consequently, the problem of a suitable voltage supply for generating the test current presents itself as a matter of principle.

SUMMARY OF THE INVENTION

Therefore, it is an objective of the present invention to develop a pulse generator circuit arrangement and a method for generating pulsed signals for insulation fault location in IT networks which simplify the process of insulation fault location in connection with the insulation monitoring and which are also usable or applicable in shut-down IT networks.

This objective is attained in one embodiment of the invention with regard to a circuit arrangement for insulation fault location in IT networks. The circuit arrangement includes a rectifier circuit for transforming the IT network voltage into a DC intermediate circuit and switching elements having a trigger signal input for switching on and off a DC intermediate circuit voltage. A circuit device downstream of the switching elements generates a pulsed current to be supplied to the IT network. A control and evaluating logic determines insulation resistance of the IT network and circuit device generates the pulsed current, which is formed as a current regulating device which allows a dynamic adjustment of the pulsed current depending on the determined insulation resistance.

According to the one embodiment of the invention, a control and evaluating logic is integrated into the pulse generator circuit arrangement, which is able to determine the insulation resistance of a connected IT network during the generation of a pulsed current. Thus, in an advantageous manner, the possibility arises to be able to perform an insulation resistance determination and the fault search at the same time by means of the pulse generator circuit arrangement. It is not necessary to interrupt the pulse sequence during the fault search in order to be able to perform an insulation resistance measurement.

The starting point of the present invention is the basic consideration that in the case of an insulation fault, a test current $I_T$ (pulsed current) flows in a current circuit which has the IT network voltage or a DC intermediate circuit voltage derived from the IT network voltage as a source voltage $U_0$ and whose electric resistance results from the series connection of an insulation fault resistance $R_F$ (insulation resistance in the fault case) and of a variable inner resistance $R_{PG}$ of the pulse generator. If now a predetermined test current $I_T$ is to flow, which is constant within the duration of one pulse, then for the known DC intermediate circuit voltage $U_0$ a specific value of the inner resistance $R_{PG}$ of the pulse generator occurs. The inner resistance $R_{PG}$ of the pulse generator can be determined internally so that according to Ohm's law and to the current-voltage relations applying to linear networks, the insulation fault resistance $R_F$ can be calculated from: $R_F=(U_0/I_T)-R_{PG}$. In order to generate a pulsed current which is constant within the duration of the impulse in a steady state, the circuit device for generating the pulsed current is formed as a current regulating device which allows a dynamic adjustment of the pulsed current while including the determined insulation resistance value. Due to this adaptive adjustment, the pulsed current can be adjusted to the electric state of the network to be examined, the electric state being represented by the determined insulation resistance. On the one hand, the pulsed current thus is in a range in which the insulation resistance can be exactly determined and on the other hand, an adjusted configuration of the pulsed current to the network conditions arises automatically.

In an advantageous implementation the current regulating device has a regulating logic for the dynamic adjustment of the pulsed current, which is connected on the input side to a current measuring device for determining an actual current value of the IT network and also to the control and evaluating logic for including a target current value that depends on the insulation resistance, the regulating logic providing on the output side a correcting value which changes the actual current value via an actuator so that on the output of the actuator an adjusted output current value occurs.

According to the preceding considerations, the insulation resistance can be determined in principle by means of any given constant test/pulsed current. However, the following practical considerations lead to the necessity of being able to change the test current: Firstly, the measuring range is limited by the minimally reachable inner resistance $R_{PG}$ of the pulse generator and also by the available source voltage $U_0$. Secondly, depending on the circuit concept, a (too) high thermal power loss has to be dissipated. Thirdly, in the case of non-linear behaviour, operation ranges of the actuator with high sensitivity and with low sensitivity to the correcting value would occur, wherein in ranges with low sensitivity the inner resistance $R_{PG}$ of the pulse generator can be determined particularly exactly.

The regulating logic thus first calculates a correcting value on the basis of an actual current value of the IT network determined by a current measuring device and of a target current value derived from the determined insulation resistance supplied by the control and evaluating logic. The correcting value acts on the actual current value via an actuator which is also supplied with the IT network's actual current value determined in the current measuring device so that an output current changed according to the regulating logic is generated.

Further, for determining the ohmic part of the insulation resistance, the control and evaluating logic is connected on the input side to the correcting value output of the regulating logic and to a voltage measuring device for measuring the IT network voltage and on the output side it passes on a target current value to the regulating logic and an internal trigger signal to the switching elements for switching on and off the DC intermediate circuit voltage.

The pulse generator circuit arrangement advantageously comprises a voltage measuring device for determining the network voltage of the IT system. From this network voltage and from the correcting value supplied by the regulating logic, the control and evaluating logic can determine the ohmic part of the insulation resistance. A value derived from this ohmic part is supplied to the regulating logic as a variable target current value and thus serves as a guiding value for the current regulating device.

Preferably, the control and evaluating logic has further inputs for an externally supplied target system value of the pulsed current and for an externally supplied system-wide trigger signal for the pulsed current sequence.

Thus, a target system value of the pulsed current as well as a system-wide trigger signal for the pulsed current sequence can be provided to the pulse generator circuit arrangement and be taken into account when calculating the target current value for the regulating logic and also when deriving the internal trigger signal.

Preferably, the pulse generator circuit arrangement has an additional power supply unit which supplies a galvanically isolated DC voltage into the DC intermediate circuit by means of an external supply voltage from another power supply network. Thus, it is made possible to be able to generate a (test) current and perform a fault search even in shut-down IT systems.

The objective on which the invention is based is further attained with regard to a method determining the insulation resistance of the IT network using a control and evaluating logic and by generating the pulsed current supplied to the IT network by means of a current regulating device in such a manner that a dynamic adjustment of the pulsed current depending on the determined insulation resistance taking place.

Corresponding to the device features of the pulse generator circuit arrangement according to embodiments of the invention, the claimed method comprises as a method step according to the invention a determination of the insulation resistance which takes place simultaneously to an insulation fault search. Further according to the invention, the supplied pulsed current is adjusted dynamically with a direct inclusion of the insulation resistance through the variation of the target current value. The insulation resistance measurement and the insulation fault location taking place parallel has the advantage that the insulation resistance can be tested repeatedly in a simple manner during insulation fault location and the thus determined value of the insulation resistance can be utilized for regulating the pulsed current which is to be supplied.

Hence, in a preferred embodiment, the current regulation for dynamically adjusting the pulsed current takes place by means of a regulating logic, which, on the basis of an actual current value of the IT network supplied by a current measuring device and of a target current value depending on the insulation resistance and supplied by the control and evaluating logic, calculates a correcting value which changes the actual current value by means of an actuator so that on the output of the actuator an adjusted output current value occurs.

Therefore, first, the current actually running in the IT network to be examined is determined by means of a current measuring device and supplied as an actual current value to a regulating logic and to an actuator. As a target value, the regulating logic receives a target current value depending on the insulation resistance from the control and evaluating logic. From these two input values, according to the implemented control behaviour, the regulating logic calculates a correction value on the basis of which a test current is defined at which the insulation resistance can be calculated as exactly as possible. The correcting value changes the actual current value via the actuator so that the desired dynamically adjusted output current value occurs. For example, the strategy to follow could be adjusting the pulsed current in such a manner that a correcting value/a correcting value factor of about 50% arises. In the case of changes in the insulation resistance value, this would then leave enough scope so the test current does not have to be readjusted instantly.

Preferably, for determining the ohmic part of the insulation resistance, the correcting value supplied by the regulating logic and the IT network voltage provided by the voltage measuring device are used as input values in the control and evaluating logic, wherein the control and evaluating logic passes on the target current value changeable depending on the determined insulation resistance to the regulating logic. The determination of the ohmic part of the insulation resistance performed simultaneous to the supply of the pulsed current takes place by means of a voltage/current measurement, wherein the IT network voltage is determined by a voltage measuring device directly connected to the IT network. The required current value is represented by the correcting value supplied by the regulating logic.

Preferably, the dynamic adjustment of the pulsed current takes place according to one or more of the criteria a) optimization of the operating range of the actuator, b) correcting value in a range which allows a determination as exact as possible of the insulation resistance, c) minimization of the power dissipation of the actuator.

The control behaviour can thus be configured to the effect that the actuator works in an optimal operating range, meaning it is not activated at the limits of its adjustment ranges, and/or the control can be configured such that the power dissipation of the actuator is minimized. Additionally, an adjustment of the pulsed current is also possible in such a manner that the correcting value is in a range which allows a determination as exact as possible of the insulation resistance, the measurement uncertainties in this range thus being at a minimum.

Preferably, the pulsed current has a pulse-shaped, alternating flow. The previously available and employed measuring technology for the insulation fault search can make a pulse-shaped flow of the pulsed current necessary. Additionally, it is functional that the pulses have an alternating polarity so that the test current flows through both conductors of an IT network.

To be able to perform a fault search in shut-down IT systems in spite of a network voltage source driving the (pulsed) current not being available, it is provided to supply a galvanically isolated DC voltage by means of an external supply voltage from another power supply network into the DC intermediate circuit.

BRIEF DESCRIPTION OF THE DRAWINGS

Further advantageous implementation features result from the following description and the drawings, which illustrate a preferred embodiment of the invention by means of an example.

DETAILED DESCRIPTION OF THE EXAMPLE EMBODIMENTS

Figure 1:
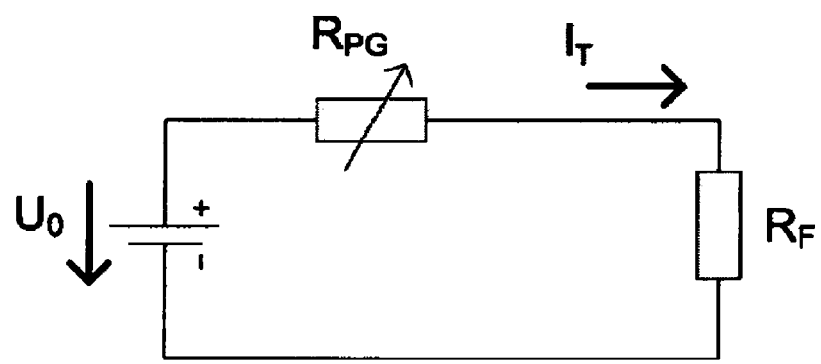
FIG. 1 shows an equivalent circuit diagram of a test current circuit.

FIG. 1 shows a simplified equivalent circuit diagram of a test current circuit for determining an insulation fault resistance $R_F$ of an IT network with a constant test current $I_T$. The source voltage $U_0$, which can be a network voltage or a derived intermediate circuit voltage, drives a test current $I_T$ through the circuit closed by the insulation fault resistance $R_F$ and the changeable inner resistance $R_{PG}$ of the pulse generator. If a predefined test current $I_T$ is to flow, a specific inner resistance $R_{PG}$ of the pulse generator occurs according to Ohm's law and to the current-voltage relations applying in linear networks. This inner resistance $R_{PG}$ can be determined from internal values (see FIG. 2) of the pulse generator so that from it the insulation fault resistance can be determined: $R_F = (U_0/I_T) - R_{PG}$.

Figure 2:
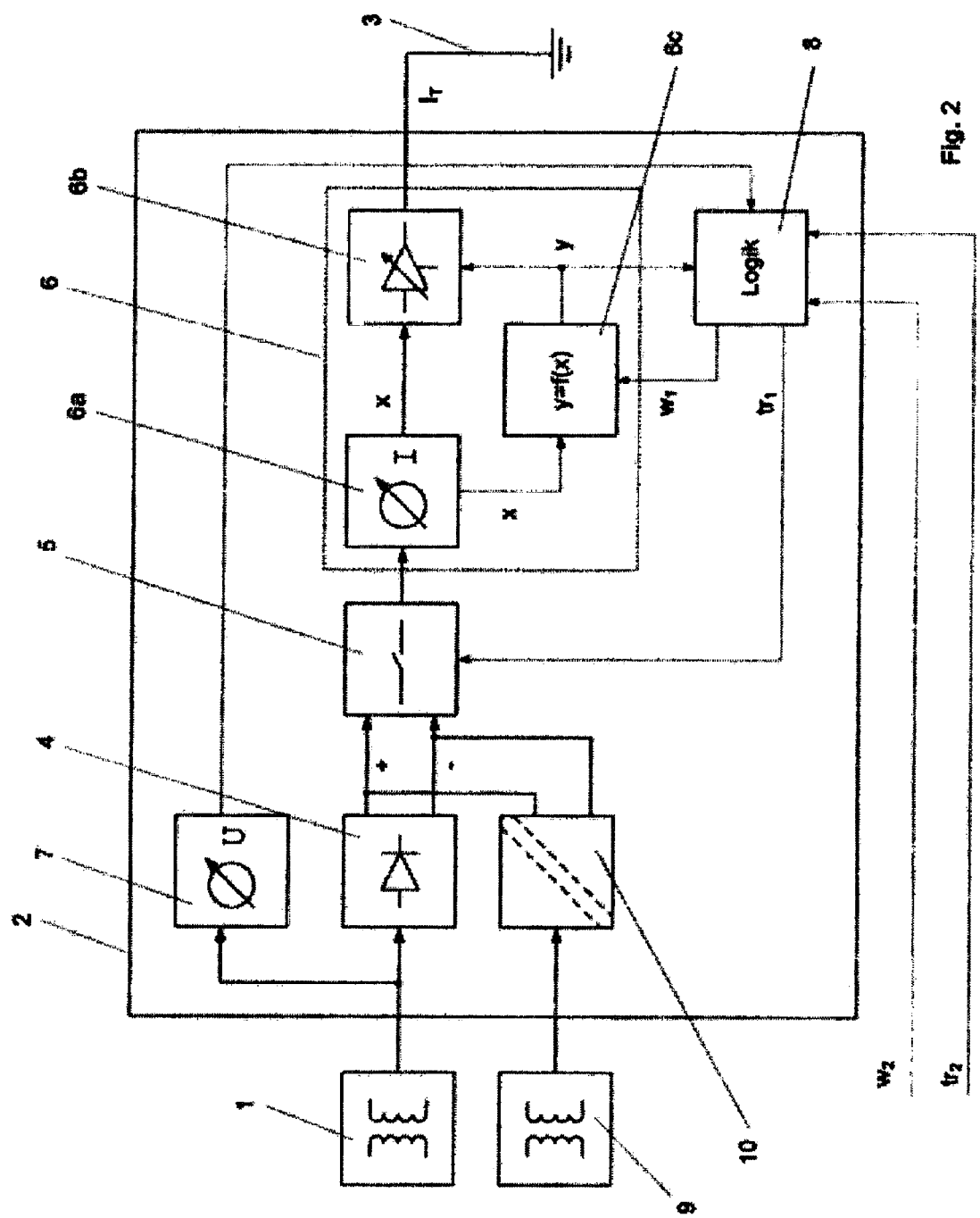
FIG. 2 shows a functional block diagram of a pulse generator circuit arrangement according to the invention.

FIG. 2 shows a functional block diagram of a pulse generator circuit arrangement 2 according to the invention in an IT system. The pulse generator 2 is connected via its system connections to the active conductors of an IT network 1 and via the earth connection to the earth lead 3. By means of a rectifier circuit 4 an alternating voltage of the IT network 1 is first transformed into a DC intermediate circuit voltage and then clocked by switching elements 5 so that it can serve as a voltage source driving a pulsed current. For clocking, an internal trigger signal $tr_1$ is supplied to the switching elements 5.

The pulsed current $I_T$ is dynamically adjusted by a circuit device 6 formed as a current regulating device 6, wherein a target value definition depending on a previously determined insulation resistance and having a target current value $w_1$ as a variable reference value takes place. With this adaptive regulation, the value of the generated pulsed current $I_T$ can be adjusted such that simultaneously to the insulation fault search a determination of the insulation resistance takes place.

The current regulating device 6 is functionally composed of a current measuring device 6a, an actuator 6b and a regulating logic 6c. The pulsed current $I_T$ driven by the clocked DC intermediate circuit voltage is determined by means of the current measuring device 6a and supplied as the actual current value x to the actuator 6b and to the regulating logic 6c. Apart from the actual current value x, the regulating logic 6c receives the internal target current value $w_1$ from a control and evaluating logic 8 and calculates a correcting signal y (correcting value) according to an implemented control algorithm. The correcting signal y is supplied to the actuator 6b in order to change the actual current value x in such a manner that a desired pulsed current $I_T$ occurs at the output of the actuator 6b.

As it can be taken from the above-described facts for the determination of the insulation resistance, the inner resistance $R_{PG}$ of the pulse generator is variable and is primarily determined by the resistance of the actuator 6b. Said resistance results from its activation by means of the correcting value y, wherein here a linear context is to be assumed for simplification. From a high correcting value y, a high electrical conducting value results in a steady-state of control since the actuator 6b is a good conductor. In contrast, for a low correcting value y, a low conducting value occurs since the actuator 6b acts as a blocker. The (inner) conducting value $G_{PG}$ thus is adjustable by a factor formed by the correcting value y: $G_{PG}$=factor*target conducting value. Thus, the inner resistance $R_{PG}$ of the pulse generator is known as well: $R_{PG}$=1/(factor*target conducting value).

Thus, a pre-adjustable pulsed current $I_T$ flows through the (test) circuit, flowing from the pulse generator 2 through the earth lead 3, the insulation fault and the lines of the IT network 1 back into the pulse generator 2. The test current pulses $I_T$ are detected by all measuring current transformers which are installed stationary in this circuit or arranged as portable measuring current transformers for insulation fault-location.

The internal target current value $w_1$ defined by the control and evaluating logic 8 depends on an insulation resistance value determined in the control and evaluating logic 8, for the calculation of which the IT network voltage measured by a voltage measuring device 7 and the correcting value y determined by the regulating logic 8 are used.

In the illustrated implementation example, a target system value $w_2$ for the test current $I_T$, from which the control and evaluating logic 8 derives an internal target current value w1 under inclusion of the insulation resistance, and an external system-wide trigger signal $tr_2$ as a basis for the internal trigger signal $tr_1$ for activating the switching elements 5 are supplied to the control and evaluating logic 8 as external signals.

If the network 1 to be examined is in a shut-down state, the driving voltage can be taken from a supplying network 9 to which a power supply unit 10 is coupled. The additional power supply unit 10 supplies a galvanically isolated DC voltage to the DC intermediate circuit which drives the pulsed current $I_T$ in the case of an IT network 1 without voltage.

Figure 3:
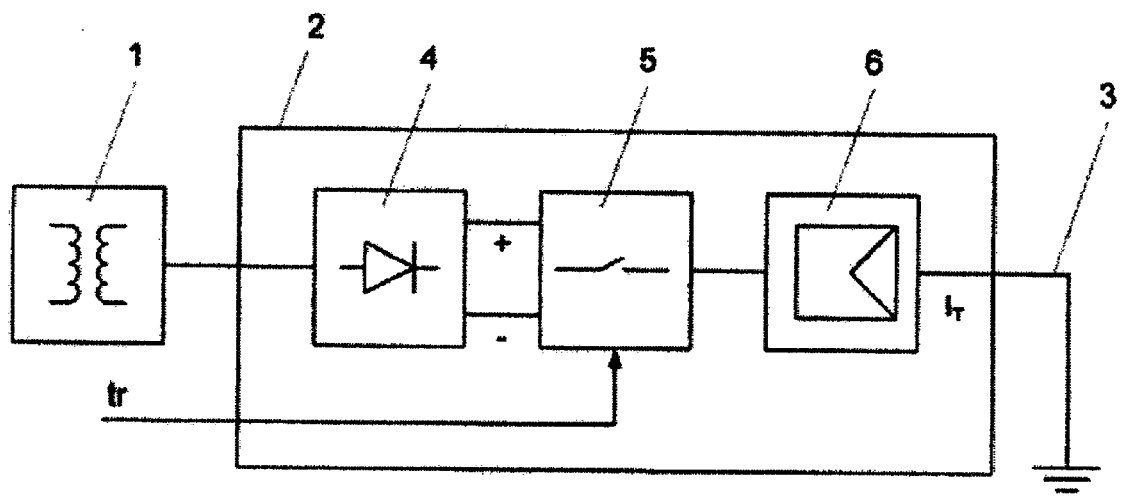
FIG. 3 shows a pulse generator according to the state of the art.

In FIG. 3, as a comparison, a pulse generator 2 according to the state of the art is illustrated. This pulse generator substantially comprises the three functional blocks rectifier circuit 4, switching elements 5 and a circuit device 6 formed as a simple current regulator 6. A dynamic adjustment of the pulsed current $I_T$ in the sense of a closed-loop control is not provided.

The invention claimed is:

1. A pulse generator circuit arrangement for insulation fault location in IT networks, said circuit arrangement comprising:
    a rectifier circuit transforming an IT network voltage into a DC intermediate circuit;
    switching elements having a trigger signal input for switching on and off a voltage of the DC intermediate circuit;
    a circuit device downstream of the switching elements generating a pulsed current to be supplied to the IT network;
    control and evaluating logic determining an insulation resistance of the IT network; and
    said circuit device generating the pulsed current, which is formed as a current regulating device which allows a dynamic adaptive adjustment of the pulsed current depending on the simultaneously determined insulation resistance.

2. A circuit arrangement according to claim 1, in which for the dynamic adjustment of the pulsed current, the current regulating device has a regulating logic which is connected on an input side to a current measuring device for determining an actual current value of the IT network and also to the control and evaluating logic for including a target current value derived from the insulation resistance and which on an output side provides a correcting value which changes the actual current value via an actuator so that on the output of the actuator an adjusted output current value occurs.

3. A circuit arrangement according to claim 1, in which the control and evaluating logic for determining an ohmic part of the insulation resistance is connected on an input side to a correcting value output of the regulating logic and to a voltage measuring device for measuring the IT network voltage and on an output side it passes on a target current value to the regulating logic and an internal trigger signal to the switching elements for switching on and off the DC intermediate circuit voltage.

4. A circuit arrangement according to claim 1, in which the control and evaluating logic has inputs for an externally supplied target system value of the pulsed current and for an externally supplied system-wide trigger signal for the pulsed current sequence.

5. A circuit arrangement according claim 1, including a power supply unit which, using an external supply voltage from another power supply network, supplies a galvanically isolated DC voltage into the DC intermediate circuit.

6. A method for generating pulsed signals for insulation fault location in IT networks, comprising the signal processing steps:
    transforming an IT network voltage into a DC intermediate circuit using a rectifier circuit;
    switching on and off of a DC intermediate circuit voltage using switching elements having a trigger signal input;
    generating a pulsed current to be supplied to the IT network;

determining insulation resistance of the IT network using control and evaluating logic; and generating the pulsed current supplied to the IT network using a current regulating device in such a manner that a dynamic adaptive adjustment of the pulsed current takes place depending on the simultaneous determined insulation resistance.

7. A method according to claim 6, in which the current regulation for the dynamic adjustment of the pulsed current takes place using a regulating logic which calculates a correcting value from an actual current value of the IT network supplied by a current measuring device and from a target current value depending on an insulation resistance supplied by the control and evaluating logic, the correcting value changing the actual current value via an actuator so that on the output of the actuator an adjusted output current value occurs.

8. A method according to claim 6, in which for determining an ohmic part of the insulation resistance, the correcting value supplied by the regulating logic and the IT network voltage provided by the voltage measuring device are used as input values in the control and evaluating logic, wherein the control and evaluating logic passes on the target current value to the regulating logic, the target current being variable depending on the determined insulation resistance.

9. A method according to claim 6, in which the dynamic adjustment of the pulsed current takes place according to one or more of the criteria a) optimization of the operating range of the actuator, b) correcting value in a range which allows a determination as exact as possible of the insulation resistance, c) minimization of the power dissipation of the actuator.

10. A method according to claim 6, in which the pulsed current has a pulse-shaped, alternating flow.

11. A method according to claim 6, in which when the IT network to be monitored is shut down, a galvanically isolated DC voltage is supplied to the DC intermediate circuit by means of an external supply voltage from another power supply network.

* * * * *